(12) United States Patent
Lee et al.

(10) Patent No.: US 12,726,192 B2
(45) Date of Patent: Sep. 1, 2026

(54) BOOTSTRAP CIRCUIT AND COMMUNICATION DEVICE INCLUDING THE SAME

(71) Applicant: SAMSUNG ELECTRONICS CO., LTD., Suwon-si (KR)

(72) Inventors: Sangheon Lee, Suwon-si (KR); Jungho Lee, Suwon-si (KR); Youngjae Cho, Suwon-si (KR); Michael Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/386,122

(22) Filed: Nov. 1, 2023

(65) Prior Publication Data

US 2024/0146292 A1 May 2, 2024

(30) Foreign Application Priority Data

Nov. 2, 2022 (KR) ........................ 10-2022-0144654
Jan. 16, 2023 (KR) ........................ 10-2023-0006317

(51) Int. Cl.
*H03K 17/06* (2006.01)
*H03K 3/356* (2006.01)
*H03K 19/0185* (2006.01)

(52) U.S. Cl.
CPC ..... *H03K 17/063* (2013.01); *H03K 3/356113* (2013.01); *H03K 19/018528* (2013.01)

(58) Field of Classification Search
None
See application file for complete search history.

(56) References Cited

U.S. PATENT DOCUMENTS 6,060,937 A 5/2000 Singer et al.
7,253,675 B2 8/2007 Aksin et al.
7,385,440 B2 6/2008 Aksin et al.
7,652,520 B2 * 1/2010 Gatta ..................... H10D 84/83 327/581
8,593,181 B2 * 11/2013 Ali ......................... H03K 17/00 327/437
9,325,312 B1 * 4/2016 Jain ...................... H03K 17/102
(Continued)

FOREIGN PATENT DOCUMENTS

EP 3203480 A1 8/2017
JP 5702357 B2 4/2015

OTHER PUBLICATIONS

"Sampling (signal processing)—Wikipedia", Oct. 7, 2021, pp. 1-9, XP0931135410, Retrieved from the Internet: URL.https://en.wikipedia.org/w/index.php?little=Samoling_(signal_processing)&oldid=1048667840, [retrieved on Feb. 27, 2024].
(Continued)

*Primary Examiner* — Thomas J. Hiltunen
(74) *Attorney, Agent, or Firm* — Sughrue Mion, PLLC

(57) ABSTRACT

A bootstrap circuit for generating an output signal through a pre-charge operation and a sample operation, includes: a sampler including a sampling switch configured to sample an input signal, a first protection switch connected between an input node and the sampling switch, and a second protection switch connected between the sampling switch and an output node; and a driver configured to drive the sampler based on a power supply voltage and the input signal.

16 Claims, 7 Drawing Sheets

(56) References Cited

U.S. PATENT DOCUMENTS

| | | | | |
|---|---|---|---|---|
| 9,484,905 | B1 * | 11/2016 | Mai | H03K 17/08122 |
| 10,163,521 | B2 | 12/2018 | Meacham | |
| 10,295,572 | B1 * | 5/2019 | Mai | H03K 5/24 |
| 10,355,686 | B2 | 7/2019 | Tang et al. | |
| 11,190,178 | B1 | 11/2021 | Collins et al. | |
| 11,962,295 | B2 * | 4/2024 | Lee | H02M 1/08 |
| 11,979,151 | B2 * | 5/2024 | Mai | H03M 1/1225 |
| 2006/0192546 | A1 * | 8/2006 | Geelen | G11C 27/024 324/94 |
| 2007/0046359 | A1 * | 3/2007 | Zanchi | G11C 27/026 327/390 |
| 2013/0249607 | A1 | 9/2013 | Park et al. | |

OTHER PUBLICATIONS

European Extended Search Report issued Mar. 14, 2024 by the European Patent Office for EP Patent Application No. 23207302.3.

* cited by examiner

| Node | Pre-Charging Phase ($\Phi_1 = 0$, $\Phi_2 = V_{DD}$) | | Sampling Phase ($\Phi_1 = V_{DD}$, $\Phi_2 = 0$) | |
|---|---|---|---|---|
| | $V_{IN} > V_{DD}$ | $V_{IN} < V_{DD}$ | $V_{IN} > V_{DD}$ | $V_{IN} < V_{DD}$ |
| A | $V_{DD}$ | $V_{DD}$ | $V_{DD} + V_{IN}$ | $V_{DD} + V_{IN}$ |
| B | 0 | 0 | $V_{IN}$ | $V_{IN}$ |
| C | $V_{DD}$ | $V_{DD}$ | $V_{IN}$ | $V_{DD}$ |
| D | 0 | 0 | $V_{DD} + V_{IN}$ | $V_{DD} + V_{IN}$ |
| E | $V_{DD}$ | $V_{DD}$ | $V_{IN}$ | $V_{IN}$ |
| F | 0 | 0 | $V_{DD} + V_{IN}$ | $V_{DD} + V_{IN}$ |
| G | 0 | 0 | $V_{IN}$ | $V_{DD}$ |
| H | $V_{DD}$ | $V_{DD}$ | 0 | 0 |
| I | 0 | 0 | $V_{DD}$ | $V_{IN}$ |
| J | $V_{DD}$ | $V_{DD}$ | $V_{IN}$ | $V_{IN}$ |
| K | $V_{DD}$ | $V_{DD}$ | $V_{DD}$ | $V_{IN}$ |
| L | $V_{DD}$ | $V_{DD}$ | $V_{DD}$ | $V_{IN}$ |
| M | $V_{DD}$ | $V_{DD}$ | $V_{IN}$ | $V_{IN}$ |
| N | 0 | 0 | $V_{DD} + V_{IN}$ | $V_{DD} + V_{IN}$ |
| O | 0 | 0 | $V_{DD} + V_{IN}$ | $V_{DD} + V_{IN}$ |
| P | 0 | 0 | $V_{IN}$ | $V_{DD}$ |
| Q | 0 | 0 | $V_{DD}$ | $V_{DD}$ |
| R | $V_{DD}$ | $V_{DD}$ | $V_{IN}$ | $V_{IN}$ |
| S | $V_{DD}$ | $V_{IN}$ | $V_{IN}$ | $V_{IN}$ |
| T | $V_{DD}$ | $V_{IN}$ | $V_{IN}$ | $V_{IN}$ |
| U | $V_{DD}$ | $V_{DD}$ | $V_{IN}$ | $V_{IN}$ |

BOOTSTRAP CIRCUIT AND COMMUNICATION DEVICE INCLUDING THE SAME

CROSS-REFERENCE TO RELATED APPLICATION

This application is based on and claims priority under 35 U.S.C. § 119 to Korean Patent Application Nos. 10-2022-0144654, filed on Nov. 2, 2022, and 10-2023-0006317, filed on Jan. 16, 2023, in the Korean Intellectual Property Office, the disclosure of which is incorporated by reference herein in its entirety.

BACKGROUND

1. Field

The disclosure relates to a bootstrap circuit, and more particularly, to a bootstrap circuit for generating an output signal by sampling an input signal that is higher than a power supply voltage, and a communication device including the same.

2. Description of Relate Art

A sampling switch is used in various analog circuits such as analog multiplexers and sample-and-hold amplifiers (SHA). To process high-resolution analog signals, it is important to improve linearity of the sampling switch.

The bootstrap circuit may be used to improve the linearity of the sampling switch. However, when the bootstrap circuit receives an analog input signal having a voltage level, which is higher than or equal to a limit of an input voltage of the sampling switch, there are some problems, for example, the sampling switch is destroyed or current leakage occurs.

SUMMARY

Provided are a bootstrap circuit capable of stable sampling of an input signal, which is higher than a power supply voltage, and a communication device including the same.

According to an aspect of the disclosure, a bootstrap circuit for generating an output signal through a pre-charge operation and a sample operation, includes: a sampler including a sampling switch configured to sample an input signal, a first protection switch connected between an input node and the sampling switch, and a second protection switch connected between the sampling switch and an output node; and a driver configured to drive the sampler based on a power supply voltage and the input signal.

According to another aspect of the disclosure, a bootstrap circuit includes: a sampler including a sampling switch configured to sample an input signal, a first protection switch connected between an input node and the sampling switch, and a second protection switch connected between the sampling switch and an output node; and a driver configured to drive the sampler by adjusting a voltage applied to the sampler based on a logic level of a control signal.

According to another aspect of the disclosure, a communication device includes: a bootstrap circuit; and a control circuit configured to generate a control signal, wherein the bootstrap circuit includes: a sampler including a sampling switch configured to sample an input signal, a first protection switch connected between an input node and the sampling switch, and a second protection switch connected between the sampling switch and an output node; and a driver configured to drive the sampler based on the control signal.

BRIEF DESCRIPTION OF DRAWINGS

Embodiments will be more clearly understood from the following detailed description taken in conjunction with the accompanying drawings in which:

FIGS. 3A and 3B are diagrams illustrating the operation of a bootstrap circuit according to an embodiment;

FIG. 4 is a table showing voltages per node of a bootstrap circuit according to an embodiment;

DETAILED DESCRIPTION

Hereinafter, one or more embodiments of the disclosure will be described with reference to the accompanying drawings.

Figure 1:
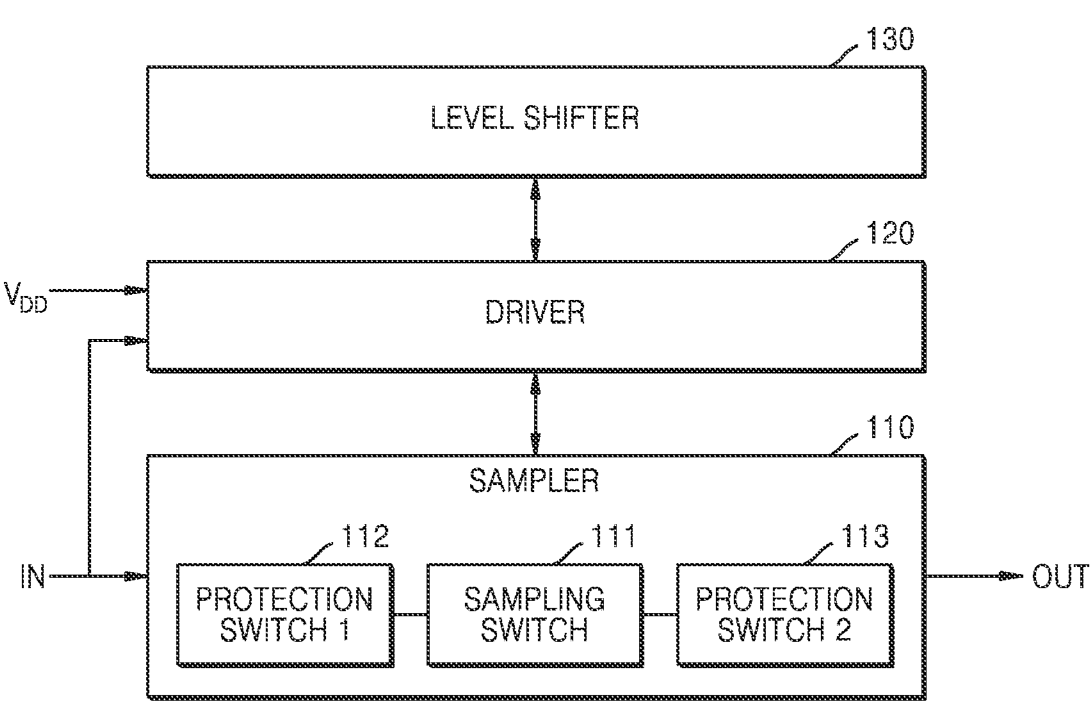
FIG. 1 is a block diagram illustrating a bootstrap circuit according to an embodiment.

FIG. 1 is a block diagram illustrating a bootstrap circuit according to an embodiment.

Bootstrap circuits may be included in or mounted on analog-to-digital converters (ADCs), digital signal processors (DSPs), central processor units (CPUs), graphics processing units (GPUs), micro-controllers, application specific integrated circuits (ASICs), field programmable gate arrays (FPGAs), programmable logic devices, and the like. Also, the bootstrap circuit may receive a power supply voltage from a charge pump. Referring to FIG. 1, the bootstrap circuit may include a sampler 110, a driver 120, and a level shifter 130.

In one embodiment, the sampler 110 may receive an input signal IN having a voltage higher than the power supply voltage through an input terminal. The sampler 110 may generate an output signal OUT having a higher voltage than the power supply voltage $V_{DD}$ by sampling the input signal IN. The sampler 110 may perform a pre-charge operation and a sample operation to generate an output signal OUT. In one embodiment, when a first control signal has a low (L) logic level and a second control signal has a high (H) logic level, the sampler 110 may perform the pre-charge operation. On the other hand, when the first control signal has a high (H) logic level and the second control signal has a low (L) logic level, the sampler 110 may perform the sample operation.

The sampler 110 may include a sampling switch 111, a first protection switch 112, and a second protection switch 113. In the disclosure, a protection switch may refer to a switch arranged to prevent a voltage higher than or equal to a voltage limit from being applied to transistors included in a bootstrap circuit. For example, the protection switch may include an n-channel metal-oxide semiconductor (NMOS) transistor or a p-channel metal-oxide semiconductor (PMOS) transistor.

The sampling switch 111 may sample the input signal IN. In the disclosure, the sampling switch 111 may refer to any switch that samples the input signal IN. For example, the sampling switch 111 may include an NMOS transistor.

In one embodiment, the first protection switch 112 and the second protection switch 113 may refer to switches connected to the sampling switch 111 to prevent a voltage higher than or equal to a voltage limit from being applied to the sampling switch 111.

In the disclosure, a voltage limit may refer to a maximum voltage that a transistor may withstand before being destroyed. The voltage limit may be also referred to as a breakdown voltage in this disclosure.

In one embodiment, the first protection switch 112 may be connected between the input node and the sampling switch. Also, the second protection switch 113 may be connected between the sampling switch and the output node. In one embodiment, the first protection switch 112 and the second protection switch 113 may be turned on regardless of the pre-charge operation and the sample operation.

In one embodiment, the driver 120 may drive the sampler 110 based on the power voltage $V_{DD}$ and the input signal IN. Specifically, the driver 120 may control voltages applied to a gate of the sampling switch 111, a gate of the first protection switch 112, and a gate of the second protection switch 113 during the pre-charge operation and the sample operation. During the pre-charge operation, the driver 120 may turn on the first protection switch 112 and the second protection switch 113. Also, during the pre-charge operation, the driver 120 may turn off the sampling switch 111. During the sample operation, the driver 120 may turn on the first protection switch 112, the second protection switch 113, and the sampling switch 111. The driver 120 may include a transistor for boosting a voltage of the input signal IN (e.g., a second PMOS transistor of FIG. 2).

In one embodiment, the level shifter 130 may control a voltage level of a gate of a transistor for boosting the voltage of the input signal IN. The operation of the level shifter 130 will be described later with reference to FIGS. 2 to 3B.

In some embodiments, the bootstrap circuit may operate based on a first control signal and a second control signal. The driver 120 may receive the first control signal and the second control signal from a control circuit that controls the bootstrap circuit. For example, when the first control signal has a high (H) logic level, the bootstrap circuit may perform a sample operation. On the other hand, when the second control signal has a high logic level, the bootstrap circuit may perform a pre-charge operation.

In an embodiment of the disclosure, unlike in the related art, the bootstrap circuit may stably sample the input signal IN even if the input signal IN is higher than the power supply voltage $V_{DD}$. In one embodiment, the bootstrap circuit may prevent the sampling switch 111 and the transistors of the bootstrap circuit from being destroyed in the process of sampling the input signal IN higher than the power supply voltage $V_{DD}$, and FIG. 2 is a circuit diagram illustrating a bootstrap circuit according to an embodiment.

Figure 2:
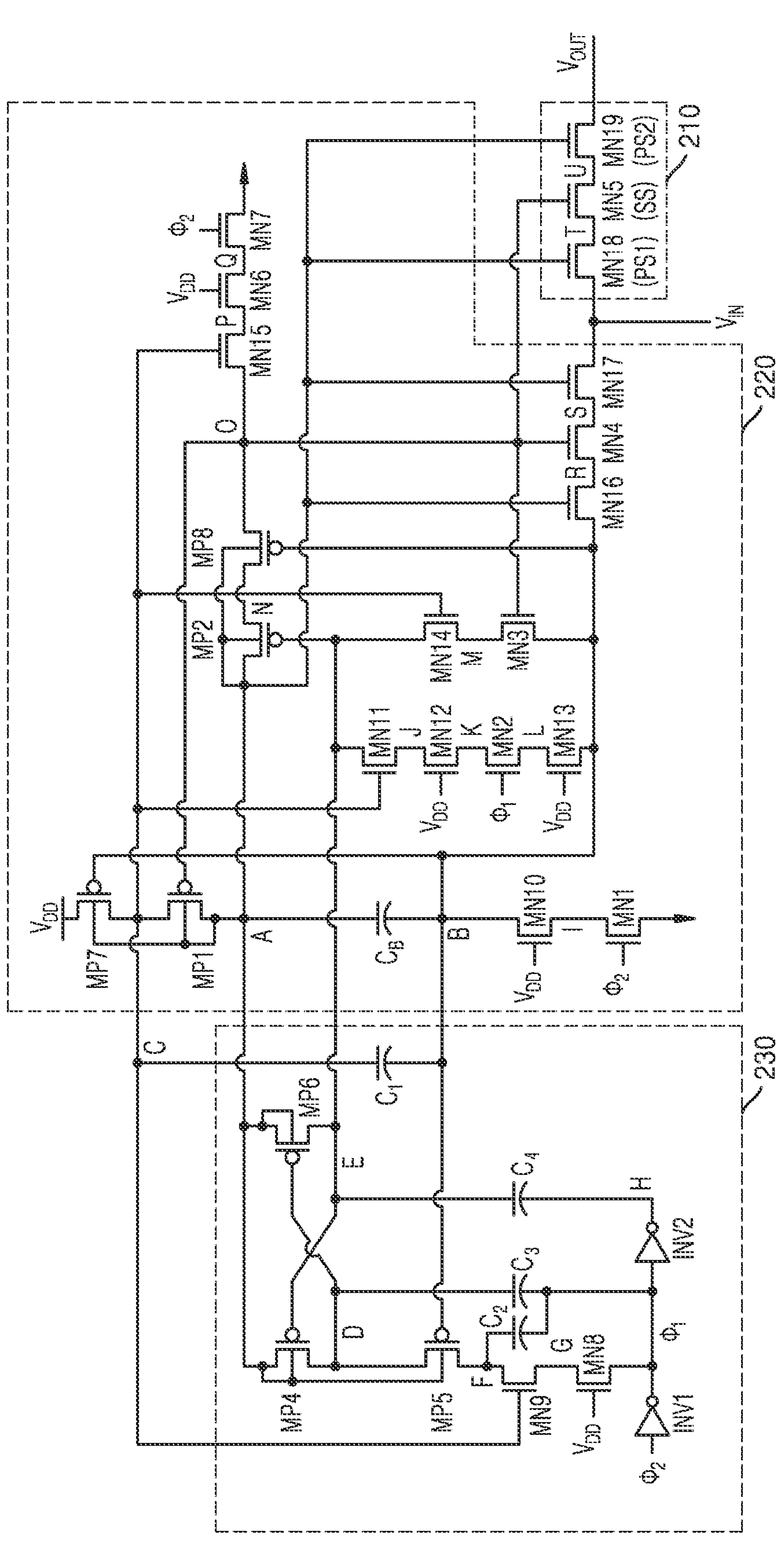
FIG. 2 is a circuit diagram illustrating a bootstrap circuit according to an embodiment.

Referring to FIG. 2, the bootstrap circuit may receive an input signal through an input node and generate an output signal through the pre-charge operation and the sample operation. The input signal may have a voltage $V_{IN}$ higher than the power supply voltage $V_{DD}$. A fifth NMOS transistor MN5, which samples the input signal, may be referred to as a sampling switch SS.

Also, the bootstrap circuit may operate based on a first control signal $\Phi_1$ and a second control signal $\Phi_2$. Specifically, the first control signal $\Phi_1$ may control a voltage applied to a gate of a second NMOS transistor MN2. Also, the second control signal $\Phi_2$ may control voltages applied to the gate of a first NMOS transistor MN1 and the gate of a seventh NMOS transistor MN7, and one end of a first inverter INV1. As the first to seventh transistors MN1 to MN7 operating based on the first control signal $\Phi_1$ and the second control signal $\Phi_2$ are turned on or off, whether the remaining transistors are turned on or off may also be determined.

The first control signal $\Phi_1$ and the second control signal $\Phi_2$ may have different logic levels based on the pre-charge operation or sample operation of the bootstrap circuit. When the first control signal $\Phi_1$ has a low (L) logic level and the second control signal $\Phi_2$ has a high (H) logic level, the bootstrap circuit may perform a pre-charge operation. On the other hand, when the first control signal $\Phi_1$ has a high (H) logic level and the second control signal $\Phi_2$ has a low (L) logic level, the bootstrap switch may perform a sample operation.

Referring to FIG. 2, the bootstrap circuit may include a sampler 210, a driver 220, and a level shifter 230.

The sampler 210 may receive an input signal having a higher voltage than a power supply voltage $V_{DD}$ through an input terminal. The sampler 210 may generate an output signal having a higher voltage than the power supply voltage $V_{DD}$ by sampling the input signal. The sampler 210 may perform a pre-charge operation and a sample operation to generate an output signal.

The sampler 210 may include a fifth NMOS transistor MN5, an eighteenth NMOS transistor MN18, and a nineteenth NMOS transistor MN19. Here, the fifth NMOS transistor MN5, which samples the input signal, may be referred to as the sampling switch SS. The eighteenth NMOS transistor MN18 and the nineteenth NMOS transistor MN19 maintain a turned-on state regardless of the pre-charge operation and the sample operation, thereby preventing a voltage higher than or equal to a voltage limit from being applied to the fifth NMOS transistor MN5.

The eighteenth NMOS transistor MN18, which is connected between the fifth NMOS transistor MN5 and the input node, may be referred to as a first protection switch PS1. Also, the nineteenth NMOS transistor MN19, which is connected between the fifth NMOS transistor MN5 and the output node, may be referred to as a second protection switch PS2. The eighteenth NMOS transistor MN18 and the nineteenth NMOS transistor MN19, which are connected to both ends of the fifth NMOS transistor MN5 (that is the sampling switch SS) may be referred to as a double protection switch of the fifth NMOS transistor MN5. The eighteenth NMOS transistor MN18 and the nineteenth NMOS transistor MN19 may prevent a voltage higher than or equal to the voltage limit from being applied to the fifth NMOS transistor MN5.

The driver 220 may include the first NMOS transistor MN1 to a fourth NMOS transistor MN4, a sixth NMOS transistor MN6, the seventh NMOS transistor MN7, a tenth NMOS transistor MN10 to a seventeenth NMOS transistor MN17, a first PMOS transistor MP1, a second PMOS transistor MP2, a seventh PMOS transistor MP7, an eighth PMOS transistor MP8, and a bootstrap capacitor $C_B$.

In one embodiment, as shown in FIG. 2, the seventh PMOS transistor MP7, the first PMOS transistor MP1, the bootstrap capacitor $C_B$, the tenth NMOS transistor MN10, and the first NMOS transistor MN1 may be connected in series.

Specifically, a drain of the seventh PMOS transistor MP7 may be connected to the power supply terminal. The first PMOS transistor MP1 may have a drain connected to a source of the seventh PMOS transistor MP7 and a body connected to a body of the seventh PMOS transistor MP7. The bootstrap capacitor $C_B$ has one end connected to a source of the first PMOS transistor MP1 and the other end connected to a drain of the tenth NMOS transistor MN10. A drain of the first NMOS transistor MN1 may be connected to a source of the tenth NMOS transistor MN10 and a source of the first NMOS transistor MN1 may be connected to a ground terminal.

The second PMOS transistor MP2, the eighth PMOS transistor MP8, the fifteenth NMOS transistor MN15, the sixth NMOS transistor MN6, and the seventh NMOS transistor MN7 may be connected in series.

Specifically, a source and a body of the second PMOS transistor MP2 may be connected to the source of the first PMOS transistor MP1. The eighth PMOS transistor MP8 has a source connected to a drain of the second PMOS transistor MP2, a body connected to the body of the second PMOS transistor MP2, and a gate connected to the other end of the bootstrap capacitor $C_B$, and a drain of the eighth PMOS transistor MP8 may be connected to the gate of the fifth NMOS transistor MN5.

A source of the fifteenth NMOS transistor MN15 may be connected to a gate of the fifth NMOS transistor MN5. The source of the sixth NMOS transistor MN6 may be connected to the drain of the fifteenth NMOS transistor MN15. The seventh NMOS transistor MN7 may have a source connected to the drain of the sixth NMOS transistor MN6 and a drain connected to the ground terminal.

The sixteenth NMOS transistor MN16, the fourth NMOS transistor MN4, and the seventeenth NMOS transistor MN17 may be connected in series.

Specifically, the source of the sixteenth NMOS transistor MN16 may be connected to the other end of the bootstrap capacitor $C_B$ and the gate may be connected to the source of the first PMOS transistor MP1. The fourth NMOS transistor MN4 may have a source connected to the drain of the sixteenth NMOS transistor MN16 and a gate connected to a gate of the first PMOS transistor MP1.

The seventeenth NMOS transistor MN17 may have a source connected to a drain of the fourth NMOS transistor MN4, a gate connected to the source of the first PMOS transistor MP1, and a drain connected to the input node.

In addition, the fourteenth NMOS transistor MN14 and the third NMOS transistor MN3 may be connected in series, and the eleventh NMOS transistor MN11, the twelfth NMOS transistor MN12, the second NMOS transistor MN2, and the thirteenth NMOS transistor MN13 may be connected in series.

The tenth NMOS transistor MN10 to the seventeenth NMOS transistor MN17, the seventh PMOS transistor MP7, and the eighth PMOS transistor MP8 maintain a turned-on state regardless of the pre-charge operation and the sample operation, so that it is possible to prevent a voltage higher than or equal to the voltage limit from being applied to the remaining transistors.

Specifically, the tenth NMOS transistor MN10 may maintain a turned-on state regardless of the pre-charge operation and the sample operation, and may prevent a voltage higher than or equal to the voltage limit from being applied to the first NMOS transistor MN1 by being connected in series with the first NMOS transistor MN1.

Similarly, the eleventh NMOS transistor MN11, the twelfth NMOS transistor MN12, and the thirteenth NMOS transistor MN13 may prevent a voltage higher than or equal to the voltage limit from being applied to the second NMOS transistor MN2, and the fourteenth NMOS transistor MN14 may prevent a voltage higher than or equal to the voltage limit from being applied to the third NMOS transistor MN3. In addition, the fifteenth NMOS transistor MN15 may prevent a voltage higher than or equal to the voltage limit from being applied to the sixth NMOS transistor MN6, and the seventh PMOS transistor MP7 may prevent a voltage higher than or equal to the voltage limit from being applied to the first PMOS transistor MP1. The eighth PMOS transistor MP8 may prevent a voltage higher than or equal to the voltage limit from being applied to the second PMOS transistor MP2.

The tenth NMOS transistor MN10 to the seventeenth NMOS transistor MN17, the seventh PMOS transistor MP7, and the eighth PMOS transistor MP8 may be referred to as stacked protection switches of transistors, to which a voltage higher than or equal to the voltage limit is prevented from being applied.

The level shifter 230 may include the first inverter INV1, a second inverter INV2, a first capacitor $C_1$ to a fourth capacitor $C_4$, an eighth NMOS transistor MN8, a ninth NMOS transistor MN9, and a fourth PMOS transistor MP4 to a sixth PMOS transistor MP6.

The level shifter 230 may control the voltage applied to a gate of the second PMOS transistor MP2 based on the power supply voltage $V_{DD}$ and the input signal. Specifically, the level shifter 230 controls the power supply voltage $V_{DD}$ to be applied to the gate of the second PMOS transistor MP2 during the pre-charge operation, so that the second PMOS transistor MP2 may be turned off. Also, the level shifter 230 controls an input voltage to be applied to the gate of the second PMOS transistor MP2 during the sample operation so that the second PMOS transistor MP2 may be turned on.

The fourth PMOS transistor MP4 may have a drain and a body connected to the source of the first PMOS transistor MP1 and a gate connected to the gate of the second PMOS transistor MP2.

The fifth PMOS transistor MP5 has a drain connected to the source of the fourth PMOS transistor MP4, a body connected to the body of the fourth PMOS transistor MP4, and a gate connected to the other end of the bootstrap capacitor $C_B$.

The sixth PMOS transistor MP6 has a drain and a body connected to the drain of the fourth PMOS transistor MP4, a gate connected to the source of the fourth PMOS transistor MP4, and a source connected to a gate of the fourth PMOS transistor MP4.

One end of the first capacitor $C_1$ may be connected to the source of the first PMOS transistor MP1 and the other end may be connected to the gate of the fifth PMOS transistor MP5.

The second capacitor $C_2$ has one end connected to a source of the fifth PMOS transistor MP5 and the other end connected to the other end of the second inverter INV2.

The third capacitor $C_3$ has one end connected to the gate of the fourth PMOS transistor MP4 and the other end connected to one end of the second inverter INV2. The fourth capacitor $C_4$ may have one end connected to the source of the sixth PMOS transistor MP6 and the other end connected to the other end of the second inverter INV2.

The eighth NMOS transistor MN8 may have a drain connected to the source of the ninth NMOS transistor MN9 and a source connected to one end of the second inverter INV2.

The ninth NMOS transistor MN9 has a drain connected to the source of the fifth PMOS transistor MP5 and a gate connected to the drain of the first PMOS transistor MP1.

Figure 3A:
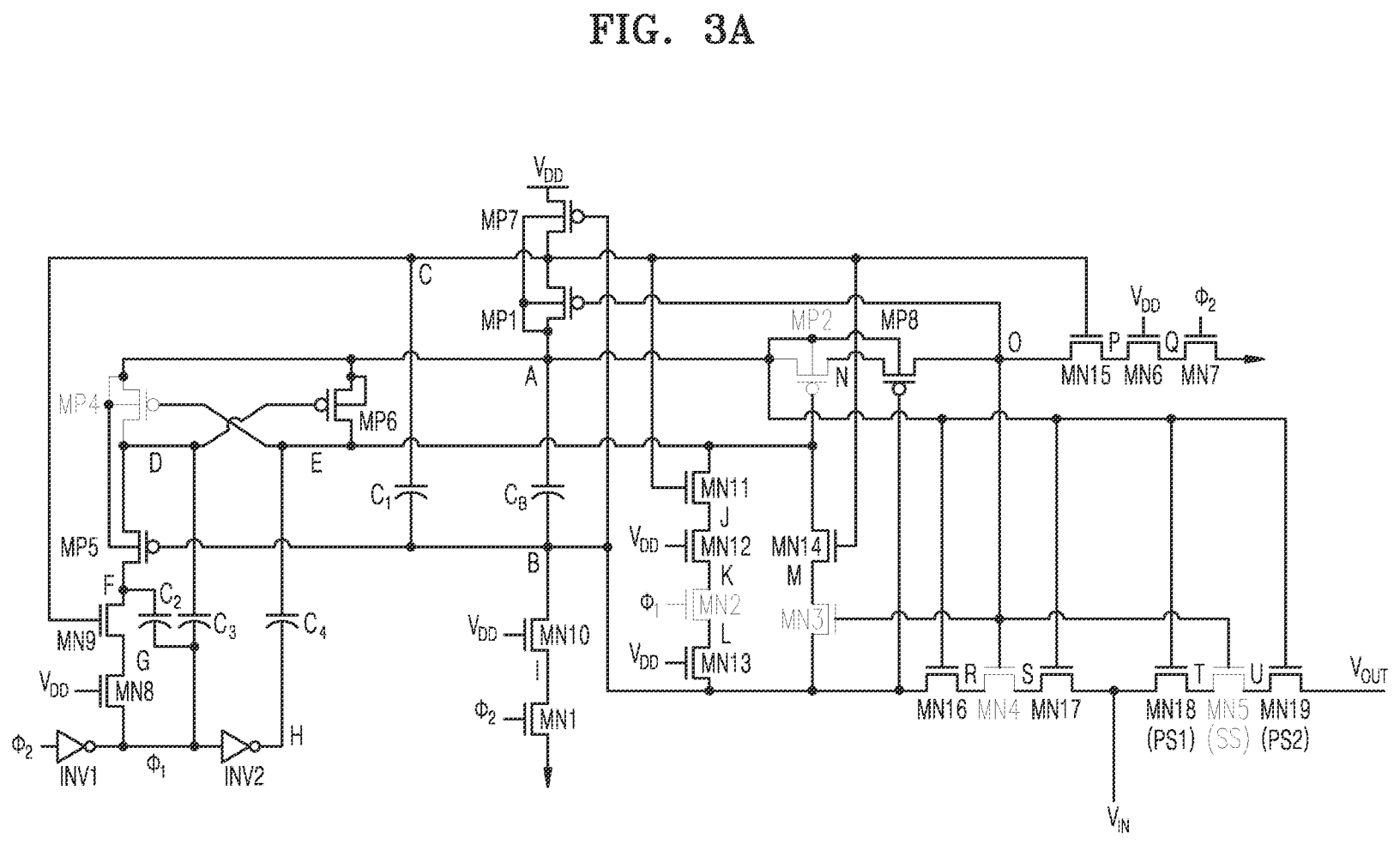
Figure 3B:
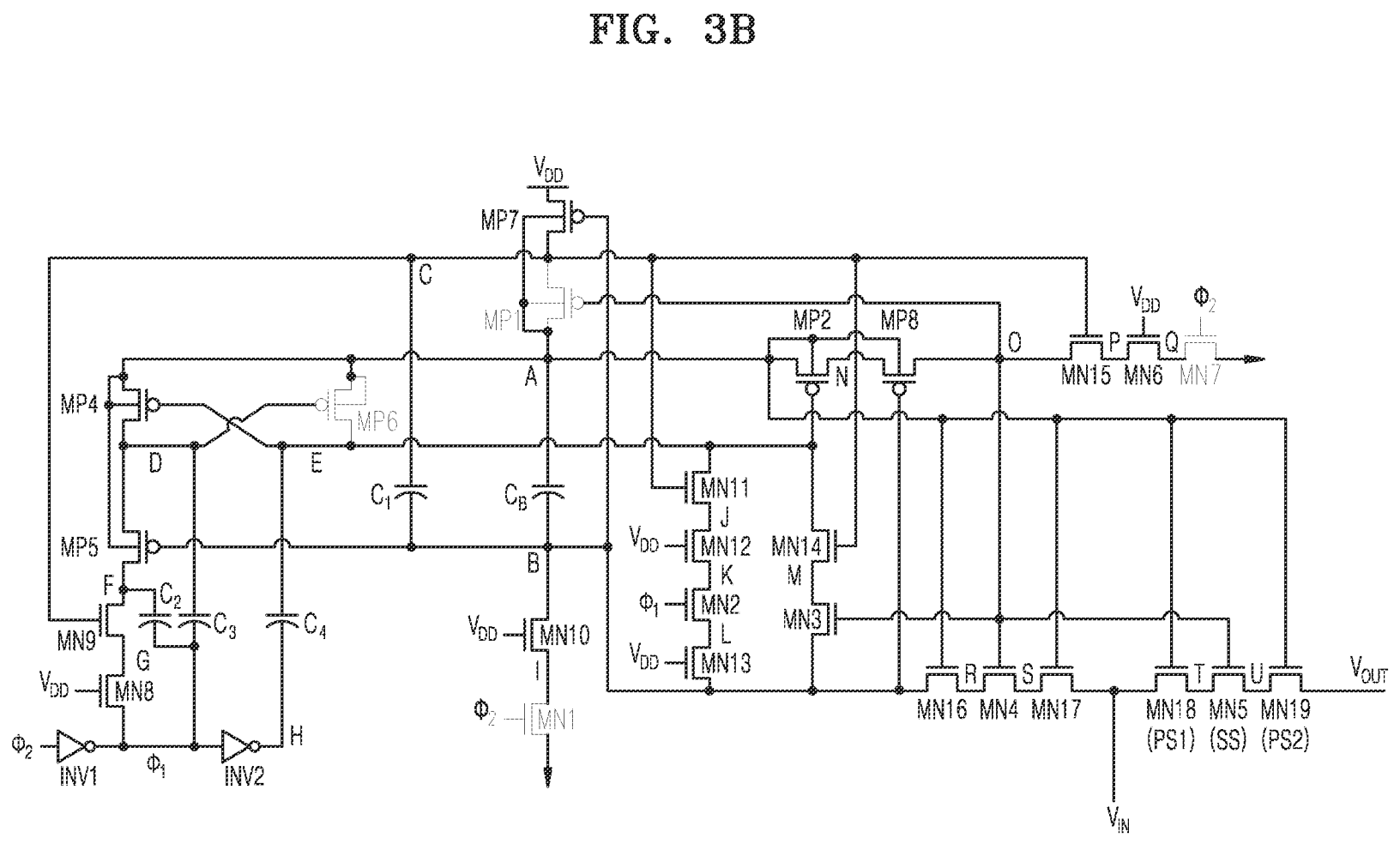

FIGS. 3A and 3B are diagrams illustrating an operation of a bootstrap circuit according to an embodiment, and FIG. 4 is a table showing voltages for each node of the bootstrap circuit according to an embodiment. FIG. 3A may show a pre-charge operation of the bootstrap circuit when the voltage $V_{IN}$ of the input signal is greater than the power supply voltage $V_{DD}$, and FIG. 3B may show a sample operation of the bootstrap circuit when the voltage $V_{IN}$ of the input signal is greater than the power supply voltage $V_{DD}$.

Referring to FIGS. 3A and 4 together, during the pre-charge operation, the first control signal $\Phi_1$ may have a low logic level and the second control signal $\Phi_2$ may have a high logic level. In the disclosure, a high logic level may correspond to a power supply voltage $V_{DD}$, and a low logic level may correspond to a ground voltage. The second NMOS transistor MN2 having a gate to which the first control signal $\Phi_1$ is applied may be turned off. Also, the first NMOS transistor MN1 and the seventh NMOS transistor MN7 having gates to which the second control signal $\Phi_2$ is applied may be turned on.

The bootstrap circuit may receive an input signal having a higher voltage than a power supply voltage $V_{DD}$. Also, the input signal may be a voltage higher than or equal to the voltage limit of transistors included in the bootstrap circuit. For example, the power supply voltage $V_{DD}$ may be about 0.7 V, the voltage limit of transistors may be about 0.95 V, and the voltage $V_{IN}$ of the input signal may be about 1.2 V.

The sixth NMOS transistor MN6, the eighth NMOS transistor MN8, the tenth NMOS transistor MN10, the twelfth NMOS transistor MN12, and the thirteenth NMOS transistor MN13 having gates to which the power supply voltage $V_{DD}$ is applied may be turned on.

The third capacitor $C_3$ and the fourth capacitor $C_4$ may be in a discharged state. Therefore, a voltage of a node D may be the ground voltage that is a voltage of the first control signal $\Phi_1$. Accordingly, the sixth PMOS transistor MP6 having a gate connected to the node D may be turned on. A voltage of a node H connected to the output terminal of the second inverter INV2 may be the power supply voltage $V_{DD}$, and a voltage of a node E may also be the power supply voltage $V_{DD}$. Accordingly, the second PMOS transistor MP2 and the fourth PMOS transistor MP4 having gates connected to the node E may be turned off.

Since the tenth NMOS transistor MN10 and the first NMOS transistor MN1 may be turned on, a node B may be connected to the ground terminal to have a ground voltage, for example, about 0 V. Accordingly, the fifth PMOS transistor MP5, the seventh PMOS transistor MP7, and the eighth PMOS transistor MP8, the gates of which are connected to the node B, may be turned on.

Since the seventh PMOS transistor MP7 may be turned on, a node C may be connected to the power supply terminal, and a voltage of the node C may be the power supply voltage $V_{DD}$. Thus, the ninth NMOS transistor MN9, the eleventh NMOS transistor MN11, the fourteenth NMOS transistor MN14, and the fifteenth NMOS transistor MN15 having gates connected to the node C may be turned on.

Since the fifteenth NMOS transistor MN15, the sixth NMOS transistor MN6, and the seventh NMOS transistor MN7 may be turned on, a node O may be connected to the ground terminal. Therefore, a voltage of the node O may be the ground voltage. The third NMOS transistor MN3 to the fifth NMOS transistor MN5 having gates connected to the node O may be turned off, and the first PMOS transistor MP1 may be turned on.

Since the first PMOS transistor MP1 and the seventh PMOS transistor MP7 may be turned on, a node A may be connected to the power supply terminal. Therefore, a voltage of the node A may be the power supply voltage $V_{DD}$. The sixteenth NMOS transistor MN16 to the nineteenth NMOS transistor MN19 having gates connected to the node A may be turned on.

Since the seventh PMOS transistor MP7, the first PMOS transistor MP1, the tenth NMOS transistor MN10, and the first NMOS transistor MN1 may be turned on, one end of the bootstrap capacitor $C_B$ may be connected to the power supply terminal, and the other end of the bootstrap capacitor $C_B$ may be connected to the ground terminal. Therefore, during the pre-charge operation, the bootstrap capacitor $C_B$ may be charged with the power supply voltage $V_{DD}$.

Since the eighteenth NMOS transistor MN18 and the nineteenth NMOS transistor MN19 may be turned on, a voltage between a gate and a source of the fifth NMOS transistor MN5 serving as a sampling switch and a voltage between a drain and a source of the fifth NMOS transistor MN5 may be less than or equal to the power supply voltage $V_{DD}$.

Similarly, since the sixteenth NMOS transistor MN16 and the seventeenth NMOS transistor MN17 may be turned on, a voltage between a gate and the source of the fourth NMOS transistor MN4 and a voltage between the drain and the source of the fourth NMOS transistor MN4 may be less than or equal to the power supply voltage $V_{DD}$.

Therefore, even if the bootstrap circuit according to the embodiment receives an input signal having a voltage higher than the power supply voltage $V_{DD}$ during a pre-charge operation, the fifth NMOS transistor MN5 serving as a sampling switch may not be destroyed. Here, the eighteenth NMOS transistor MN18 and the nineteenth NMOS transistor MN19, which prevent the fifth NMOS transistor MN5 from being destroyed, may be referred to as a double protection switch of the fifth NMOS transistor MN5. Also, the sixteenth NMOS transistor MN16 and the seventeenth NMOS transistor MN17, which prevent the fourth NMOS transistor MN4 from being destroyed, may be referred to as a double protection switch of the fourth NMOS transistor MN4.

Referring to FIGS. 3B and 4 together, during a sample operation, the first control signal $\Phi_1$ may have a high logic level and the second control signal $\Phi_2$ may have a low logic level. The second NMOS transistor MN2 to which the first control signal $\Phi_1$ is applied to the gate may be turned on. Also, the first NMOS transistor MN1 and the seventh NMOS transistor MN7 to which the second control signal $\Phi_2$ is applied to gates may be turned off.

The bootstrap circuit may receive an input signal having a higher voltage than a power supply voltage $V_{DD}$. Also, the voltage of the input signal may be higher than or equal to the voltage limit of transistors included in the bootstrap circuit.

The sixth NMOS transistor MN6, the eighth NMOS transistor MN8, the tenth NMOS transistor MN10, the twelfth NMOS transistor MN12, and the thirteenth NMOS transistor MN13 having gates to which the power supply voltage $V_{DD}$ is applied may be turned on.

The bootstrap capacitor $C_B$ may be charged to the power supply voltage $V_{DD}$ during a pre-charge operation and then discharged during a sample operation. Therefore, the voltage of the node A may be higher than a voltage of the node B. Accordingly, the fifth PMOS transistor MP5, the seventh PMOS transistor MP7, and the eighth PMOS transistor MP8, the gates of which are connected to the node B and the bodies of which are connected to the node A, may be turned on. In addition, the sixteenth NMOS transistor MN16 to the nineteenth NMOS transistor MN19 having gates connected to the node A may be turned on. In other words, the voltage between the gate and the source of the sixteenth NMOS transistor MN16 to the nineteenth NMOS transistor MN19 may be maintained at the power supply voltage regardless of the voltage of the input signal due to the bootstrap capacitor $C_B$. Through this, the linearity of the bootstrap capacitor $C_B$ may be secured.

Since the seventh PMOS transistor MP7 may be turned on, the voltage of the node C may be the power supply voltage $V_{DD}$. Accordingly, the ninth NMOS transistor MN9, the eleventh NMOS transistor MN11, the fourteenth NMOS transistor MN14, and the fifteenth NMOS transistor MN15 having gates connected to the node C may be turned on.

The third capacitor $C_3$ may pull up the voltage of the node D during the sample operation. Accordingly, the sixth PMOS transistor MP6, the gate of which is connected to the node D, may be turned off. The fourth capacitor $C_4$ may pull down the voltage of the node E. Accordingly, the fourth PMOS transistor MP4, the gate of which is connected to the node E, may be turned on.

Since the fourth capacitor $C_4$ may pull down the voltage of the node E, the voltage of the node E may be lower than the voltage of the node A. Accordingly, the second PMOS transistor MP2 having a gate connected to the node E and a body connected to the node A may be turned on.

Since the second PMOS transistor MP2 and the eighth PMOS transistor MP8 may be turned on, the voltage of the node O may be the same as that of the node A. In other words, the voltage of the node O may be a higher voltage than the voltage of the node B by the voltage charged in the bootstrap capacitor $C_B$. Specifically, the voltages of the node A and the node O may be a voltage obtained by adding the power supply voltage $V_{DD}$ to the voltage $V_{IN}$ of the input signal. Accordingly, the first PMOS transistor MP1 having a gate connected to the node O and a body connected to the node A may be turned off. Also, the third NMOS transistor MN3 to the fifth NMOS transistor MN5 having gates connected to the node O may be turned on.

Since the seventh PMOS transistor MP7 may be turned on, the voltage between the gate and drain of the first PMOS transistor MP1 may be less than or equal to the power supply voltage $V_{DD}$. Similarly, since the fifteenth NMOS transistor MN15 may be turned on, the voltage between the drain and source of the sixth NMOS transistor MN6 may be less than the power supply voltage $V_{DD}$. Also, since the tenth NMOS transistor MN10 may be turned on, the voltage between the drain and source of the first NMOS transistor MN1 may be less than or equal to the power supply voltage $V_{DD}$.

Therefore, even if the bootstrap circuit according to the embodiment receives an input signal having a voltage higher than the power supply voltage $V_{DD}$ during the sample operation, the first PMOS transistor MP1, the sixth NMOS transistor MN6, and the first NMOS transistor MN1 may not be destroyed.

Here, the seventh PMOS transistor MP7, which prevents the first PMOS transistor MP1 from being destroyed, may be referred to as a stacked protection switch of the first PMOS transistor MP1. Here, the stacked protection switch may refer to a switch connected in series with a transistor to prevent a voltage higher than or equal to a voltage limit from being applied to the transistor. Therefore, the fifteenth NMOS transistor MN15 and the tenth NMOS transistor MN10, which prevent the sixth NMOS transistor MN6 and the first NMOS transistor MN1 from being destroyed, may be referred to as a stacked protection switch of the sixth NMOS transistor MN6 and a stacked protection switch of the first NMOS transistor MN1, respectively.

When switching from pre-charge operation to sample operation or from sample operation to pre-charge operation, a voltage greater than or equal to the voltage limit may be momentarily applied to the second NMOS transistor MN2, the third NMOS transistor MN3, and the second PMOS transistor MP2. To prevent this, the bootstrap circuit may include an eleventh NMOS transistor MN11 to a fourteenth NMOS transistor MN14 and an eighth PMOS transistor MP8.

The eleventh NMOS transistor MN11 to the thirteenth NMOS transistor MN13 may be referred to as stacked protection switches of the second NMOS transistor MN2. The fourteenth NMOS transistor MN14 may be referred to as a stacked protection switch of the third NMOS transistor MN3. The eighth PMOS transistor MP8 may be referred to as a stacked protection switch of the second PMOS transistor MP2.

When an input signal higher than the power supply voltage $V_{DD}$ is applied, the stack protection switch may prevent a voltage higher than the voltage limit from being applied to the first PMOS transistor MP1, the second PMOS transistor MP2, the first NMOS transistor MN1, the second NMOS transistor MN2, the third NMOS transistor MN3, and the sixth NMOS transistor MN6.

Thus, in a bootstrap circuit according to an embodiment, during the sample operation, since a voltage higher than or equal to the voltage limit may not be applied to the first NMOS transistor MN1 to the seventh NMOS transistor MN7, the first PMOS transistor MP1, and the second PMOS transistor MP2, transistors may not be destroyed.

Figure 5:
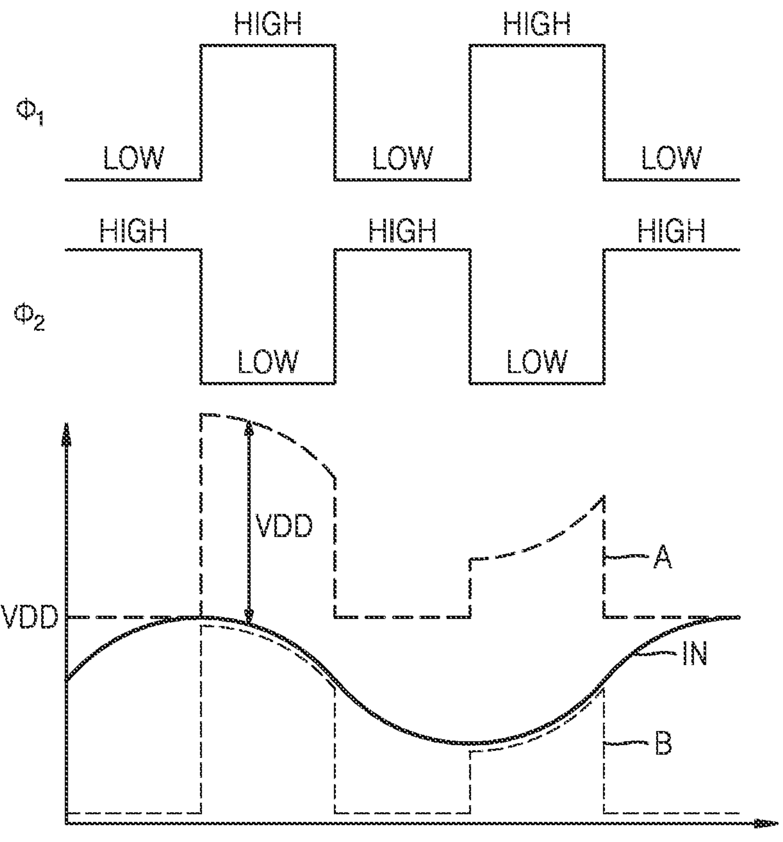
FIG. 5 is a diagram illustrating signals in a bootstrap circuit according to an embodiment.

FIG. 5 is a diagram illustrating signals in a bootstrap circuit according to an embodiment.

Referring to FIG. 5, the voltages of the node A and the node B are shown based on the first control signal $\Phi_1$, the second control signal $\Phi_2$, and the input signal. FIG. 5 may be described with reference to FIGS. 3A and 3B.

When the first control signal $\Phi_1$ has a low logic level and the second control signal $\Phi_2$ has a high logic level, the bootstrap circuit may perform a pre-charge operation. At this time, the voltage of the node A may be the power supply voltage $V_{DD}$, and the voltage of the node B may be the ground voltage.

When the first control signal $\Phi_1$ is at a high logic level and the second control signal $\Phi_2$ is at a low logic level, the bootstrap circuit may perform a sample operation. At this time, the voltage of the node A may be the voltage obtained by adding the power supply voltage $V_{DD}$ to the voltage of the input signal, and the voltage of the node B may be the voltage of the input signal.

Figure 6:
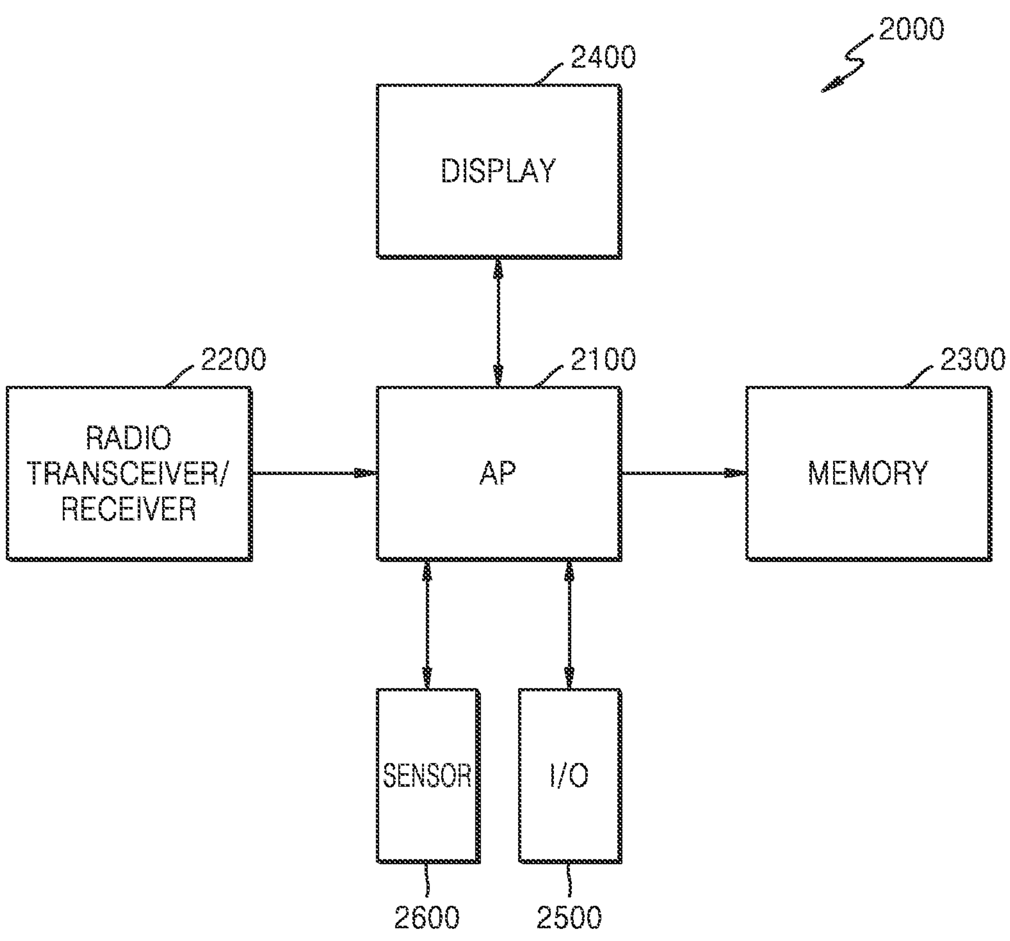
FIG. 6 is a block diagram illustrating an Internet of things (IoT) device according to an embodiment.

FIG. 6 is a block diagram illustrating an Internet of things (IoT) device according to an embodiment.

Referring to FIG. 6, a bootstrap circuit according to embodiments of the disclosure may be included in an IoT device 2000. IoT may refer to a network between objects using wired/wireless communication. IoT devices may include devices that have accessible wired or wireless interfaces and transmit or receive data by communicating with at least one other device through the wired or wireless interface. The accessible interface may include a wired Local Area Network (LAN) interface, a Wireless Local Area Network (WLAN) interface, such as Wi-Fi, a Wireless Personal Area Network (WPAN) interface, such as Bluetooth, a Wireless Universal Serial Bus (USB) interface, a Zigbee interface, an NFC interface, a Radio-frequency identification (RFID) interface, a Power Line Communication (PLC) interface, or a modem communication interface capable of accessing a mobile cellular network, such as 3G, 4G, and LTE. The Bluetooth interface may support Bluetooth Low Energy (BLE).

Specifically, the IoT device 2000 may include a communication interface 2200 for communicating with the outside.

The communication interface 2200 may be, for example, a LAN interface, a wireless local area communication interface, such as Bluetooth, Wi-Fi, Zigbee, a PLC interface, or a modem communication interface accessible to 3G, LTE, and the like. The communication interface 2200 may include a transceiver and/or receiver. The IoT device 2000 may transmit and/or receive information from an access point or gateway through the transceiver and/or receiver. In addition, the IoT device 2000 may transmit and/or receive control information or data of the IoT device 2000 by communicating with a user device or another IoT device.

In this embodiment, the receiver included in the communication interface 2200 may include a bootstrap circuit, and the bootstrap circuit may be implemented according to the above description with reference to FIGS. 1 to 5. For example, the bootstrap circuit may be implemented with the sampler 110, driver 120, and level shifter 130 of FIG. 1. In addition, the bootstrap circuit may be implemented with the sampler 210, the driver 220, and the level shifter 230 of FIG. 2. Specifically, a receiver included in the communication interface 2200 may include a bootstrap circuit. Also, the communication interface 2200 may further include a control circuit that controls the bootstrap circuit. The control circuit may generate a first control signal and a second control signal, and the bootstrap circuit may operate based on the first control signal and the second control signal, as described above with reference to FIGS. 1 to 5.

The IoT device 2000 may further include a processor or access point (AP) 2100 that performs calculations. The IoT device 2000 may further include a built-in battery for internal power supply or a power supply unit receiving external power. In addition, the IoT device 2000 may include a display 2400 for displaying an internal state or data. A user may control the IoT device 2000 through a user interface (UI) of the display 2400 of the IoT device 2000. The IoT device 2000 may transmit an internal state and/or data to the outside through the transceiver and receive a control command and/or data from the outside through the receiver.

The memory 2300 may store control command codes for controlling the IoT device 2000, control data, or user data. The memory 2300 may include at least one of volatile memory and non-volatile memory. The non-volatile memory may include at least one of various memories, such as read only memory (ROM), programmable ROM (PROM), electrically programmable ROM (EPROM), electrically erasable and programmable ROM (EEPROM), flash memory, phase-change RAM (PRAM), magnetic RAM (MRAM), Resistive RAM (ReRAM), and Ferroelectric RAM (FRAM). The volatile memory may include at least one of various memories, such as dynamic RAM (DRAM), static RAM (SRAM), and synchronous DRAM (SDRAM).

The IoT device 2000 may further include a storage device. The storage device may be a nonvolatile medium, such as a hard disk (HDD), a solid state disk (SSD), an embedded multimedia card (eMMC), or a universal flash storage (UFS). The storage device may store user information provided through an input/output (I/O) 2500 and sensing information collected through a sensor 2600.

While the disclosure has been particularly shown and described with reference to embodiments thereof, it will be understood that various changes in form and details may be made therein without departing from the spirit and scope of the following claims.

What is claimed is:

1. A bootstrap circuit for generating an output signal through a pre-charge operation and a sample operation, the bootstrap circuit comprising:
- a sampler comprising:
  - a sampling switch configured to sample an input signal,
  - a first protection switch connected between an input node and the sampling switch, and
  - a second protection switch connected between the sampling switch and an output node; and
- a driver configured to drive the sampler based on a power supply voltage and the input signal,
- wherein the bootstrap circuit further comprises a first capacitor and a level shifter configured to control a first voltage based on the power supply voltage and the input signal,
- wherein the level shifter comprises a second capacitor,
- wherein the driver comprises:
- a first p-channel metal-oxide semiconductor (PMOS) transistor comprising:
  - a source,
  - a body, and
- a drain connected to a power supply terminal;
- a second PMOS transistor comprising:
  - a source,
  - a body connected to the body of the first PMOS transistor, and
  - a drain connected to the source of the first PMOS transistor,
- a bootstrap capacitor comprising:
  - one end connected to the source of the second PMOS transistor, and
  - another end;
- a first n-channel metal-oxide semiconductor (NMOS) transistor comprising a drain connected to the other end of the bootstrap capacitor; and
- a second NMOS transistor comprising a drain connected to the source of the first NMOS transistor and a source connected to a ground terminal, and
- wherein the first capacitor is the bootstrap capacitor.

2. The bootstrap circuit of claim 1, wherein the bootstrap capacitor is configured to be charged by turning on the first PMOS transistor, the second PMOS transistor, the first NMOS transistor, and the second NMOS transistor during the pre-charge operation.

3. The bootstrap circuit of claim 1, wherein the driver is configured to turn on the first protection switch and the second protection switch by applying the power supply voltage to a gate of the first protection switch and a gate of the second protection switch during the pre-charge operation.

4. The bootstrap circuit of claim 1, wherein the driver is configured to turn off the sampling switch by applying a ground voltage to a gate of the sampling switch during the pre-charge operation.

5. The bootstrap circuit of claim 1, wherein the bootstrap capacitor is configured to be discharged when the second PMOS transistor and the second NMOS transistor are turned off during the sample operation.

6. The bootstrap circuit of claim 1, wherein the driver is configured to turn on the sampling switch by applying a voltage to a gate of the sampling switch during the sample operation, and
- wherein the voltage is obtained by adding the power supply voltage to the voltage of the input signal.

7. The bootstrap circuit of claim 1, wherein the driver further comprises:
- a third NMOS transistor comprising:
  - a source connected to the other end of the bootstrap capacitor,
  - a drain, and a gate connected to the source of the second PMOS transistor;

a fourth NMOS transistor comprising:

a source connected to the drain of the third NMOS transistor, a drain, and a gate connected to the gate of the second PMOS transistor; and a fifth NMOS transistor comprising:

a source connected to the drain of the fourth NMOS transistor, a gate connected to the source of the second PMOS transistor, and a drain connected to the input node.

8. The bootstrap circuit of claim 1, wherein the driver further comprises:

a third PMOS transistor comprising:

a source, a gate, a drain, and a body connected to the source of the second PMOS transistor; and a fourth PMOS transistor comprising:

a source connected to the drain of the third PMOS transistor, a body connected to the body of the third PMOS transistor, a gate connected to the other end of the bootstrap capacitor, and a drain connected to the gate of the sampling switch.

9. The bootstrap circuit of claim 8, wherein the first voltage is applied to the gate of the third PMOS transistor.

10. The bootstrap circuit of claim 1, wherein the driver comprises:

a first NMOS transistor comprising:

a drain, and a source connected to a gate of the sampling switch;

a second NMOS transistor comprising:

a drain, and a source connected to the drain of the first NMOS transistor; and a third NMOS transistor comprising a source connected to the drain of the second NMOS transistor and a drain connected to a ground terminal.

11. A bootstrap circuit comprising:

a sampler comprising:

a sampling switch configured to sample an input signal, a first protection switch connected between an input node and the sampling switch, and a second protection switch connected between the sampling switch and an output node; and a driver configured to drive the sampler by adjusting a voltage applied to the sampler based on a logic level of a control signal, wherein the bootstrap circuit further comprises a first capacitor and a level shifter configured to control a first voltage based on a power supply voltage and the input signal, and wherein the level shifter comprises a second capacitor, wherein the driver comprises:

a first p-channel metal-oxide semiconductor (PMOS) transistor comprising:

a source, a body, and a drain connected to a power supply terminal;

a second PMOS transistor comprising:

a source, a body connected to the body of the first PMOS transistor, and a drain connected to the source of the first PMOS transistor, a bootstrap capacitor comprising:

one end connected to the source of the second PMOS transistor, and another end;

a first n-channel metal-oxide semiconductor (NMOS) transistor comprising a drain connected to the other end of the bootstrap capacitor; and a second NMOS transistor comprising a drain connected to the source of the first NMOS transistor and a source connected to a ground terminal, and wherein the first capacitor is the bootstrap capacitor.

12. The bootstrap circuit of claim 11, wherein the bootstrap capacitor is provided between the power supply terminal and the ground terminal, wherein, based on the control signal that is at a high logic level, one end of the bootstrap capacitor is connected to the power supply terminal and the other end of the bootstrap capacitor is connected to the ground terminal to charge the bootstrap capacitor.

13. The bootstrap circuit of claim 11, wherein, based on the control signal that is a high logic level, the driver is configured to turn on the first protection switch and the second protection switch by applying the power supply voltage to a gate of the first protection switch and a gate of the second protection switch.

14. The bootstrap circuit of claim 11, wherein, based on the control signal that is a high logic level, the driver is configured to turn off the sampling switch by applying a ground voltage to a gate of the sampling switch.

15. A communication device comprising:

a bootstrap circuit; and a control circuit configured to generate a control signal, wherein the bootstrap circuit comprises:

a sampler comprising:

a sampling switch configured to sample an input signal, a first protection switch connected between an input node and the sampling switch, and a second protection switch connected between the sampling switch and an output node; and a driver configured to drive the sampler based on the control signal, wherein the bootstrap circuit further comprises and a first capacitor a level shifter configured to control a first voltage based on a power supply voltage and the input signal, and wherein the level shifter comprises a second capacitor, wherein the driver comprises:

a first p-channel metal-oxide semiconductor (PMOS) transistor comprising:

a source, a body, and a drain connected to a power supply terminal;

a second PMOS transistor comprising:

a source, a drain connected to the source of the first PMOS transistor, and a body connected to the body of the first PMOS transistor;

a bootstrap capacitor comprising one end connected to the source of the second PMOS transistor;

a first n-channel metal-oxide semiconductor (NMOS) transistor comprising a drain connected to another end of the bootstrap capacitor; and a second NMOS transistor comprising a drain connected to the source of the first NMOS transistor and a source connected to a ground terminal, and wherein the first capacitor is the bootstrap capacitor.

16. The communication device of claim 15, wherein the driver comprises:

a third PMOS transistor comprising:

a drain, a gate, a source, and a body connected to the source of the second PMOS transistor; and a fourth PMOS transistor comprising:

a source connected to the drain of the third PMOS transistor, a body connected to the body of the third PMOS transistor, a gate connected to the other end of the bootstrap capacitor, and a drain connected to a gate of the sampling switch.

* * * * *